United States Patent

Kudo et al.

[11] Patent Number: 5,963,510
[45] Date of Patent: Oct. 5, 1999

[54] TIME MEASUREMENT DEVICE

[75] Inventors: Takahiro Kudo; Masato Takahashi; Nobuhisa Kato; Kimihiro Nakamura, all of Tokyo, Japan

[73] Assignee: Fuji Electric Co., Ltd., Kawasaki, Japan

[21] Appl. No.: 08/922,857

[22] Filed: Sep. 3, 1997

[30] Foreign Application Priority Data

Sep. 4, 1996 [JP] Japan .................................... 8-233811

[51] Int. Cl.[6] ........................................................ G04F 8/00
[52] U.S. Cl. .............................................. 368/118; 368/120
[58] Field of Search .................. 368/118–120, 107–113, 368/115

[56] References Cited

U.S. PATENT DOCUMENTS

| | | | |
|---|---|---|---|
| 4,737,942 | 4/1988 | Nishibe | 368/118 |
| 4,904,947 | 2/1990 | Olivenbaum et al. | 368/118 |

FOREIGN PATENT DOCUMENTS

| | | |
|---|---|---|
| 4113119 | 10/1992 | Germany . |
| 07072273 | 3/1995 | Japan . |
| 772273 | 3/1995 | Japan . |

*Primary Examiner*—Bernard Roskoski
*Attorney, Agent, or Firm*—Greer,Burns & Crain Ltd.

[57] ABSTRACT

A time measurement device for measuring a duration of an input signal based on a clock signal comprises a first gate for outputting a gate signal based on an input signal; a first holding circuit for holding the gate signal at the time of falling of the clock signal; a second holding circuit for holding the gate signal at the time of rising of the clock signal; a second gate for passing the clock signal according to either of the widths of output signals of the first and second holding circuits; a third holding circuit for holding an output state of the second holding circuit at the timing of a leading edge of an output of the first holding circuit; a fourth holding circuit for holding an output state of the second holding circuit at the timing of a trailing edge of an output of the first holding circuit; and a counter for counting the clock signal output from the second gate. The count value is corrected based on the outputs of the third and fourth holding circuits.

14 Claims, 14 Drawing Sheets

| | GATE WIDTH | COUNT VALUE | BOA | BOB | CORRECTION RESULT | ERROR RANGE |
|---|---|---|---|---|---|---|
| CASE (1) | 4.5~5.5CLK | 5 | 1 | 1 | $10 \times \frac{1}{2}$CLK | $(5 \pm 0.5)$CLK |
| CASE (2) | 4~5 CLK | 5 | 1 | 0 | $9 \times \frac{1}{2}$CLK | $(4.5 \pm 0.5)$CLK |
| CASE (3) | 4~5 CLK | 5 | 0 | 1 | $9 \times \frac{1}{2}$CLK | $(4.5 \pm 0.5)$CLK |
| CASE (4) | 3.5~4.5CLK | 5 | 0 | 0 | $8 \times \frac{1}{2}$CLK | $(4 \pm 0.5)$CLK |

| | GATE WIDTH | COUNT VALUE | BOA' | BOB' | CORRECTION DATA | CORRECTION RESULT | ERROR RANGE |
|---|---|---|---|---|---|---|---|
| CASE(1) | 4.5~5.5CLK | 5.0CLK | 1 | 0 | 0 | (10×1/2)=5.0CLK | (5.0±0.5)CLK |
| CASE(2) | 4.0~5.0CLK | 5.0CLK | 1 | 1 | −1 | (9×1/2)=4.5CLK | (4.5±0.5)CLK |
| CASE(3) | 4.0~5.0CLK | 4.0CLK | 0 | 0 | +1 | (9×1/2)=4.5CLK | (4.5±0.5)CLK |
| CASE(4) | 3.5~4.5CLK | 4.0CLK | 0 | 1 | 0 | (8×1/2)=4.0CLK | (4.0±0.5)CLK |
| CASE(5) | 5.0CLK | 5.0CLK | 1 | 1 | −1 | (9×1/2)=4.5CLK | (4.5+0.5)CLK |
| CASE(6) | 5.0CLK | 4.0CLK | 0 | 0 | +1 | (9×1/2)=4.5CLK | (4.5+0.5)CLK |
| CASE(7) | 4.5CLK | 5.0CLK | 0 | 1 | 0 | (10×1/2)=5CLK | (5.0−0.5)CLK |
| CASE(8) | 4.5CLK | 5.0CLK | 1 | 0 | 0 | (10×1/2)=5CLK | (5.0−0.5)CLK |

TIME MEASUREMENT DEVICE

BACKGROUND OF THE INVENTION

1. Field of the Invention

The present invention relates to a time measurement device for measuring a time signal or a periodic signal output from, for example, a sensor of a process device such as a differential pressure detecting device.

2. Description of the Related Art

Figure 1:
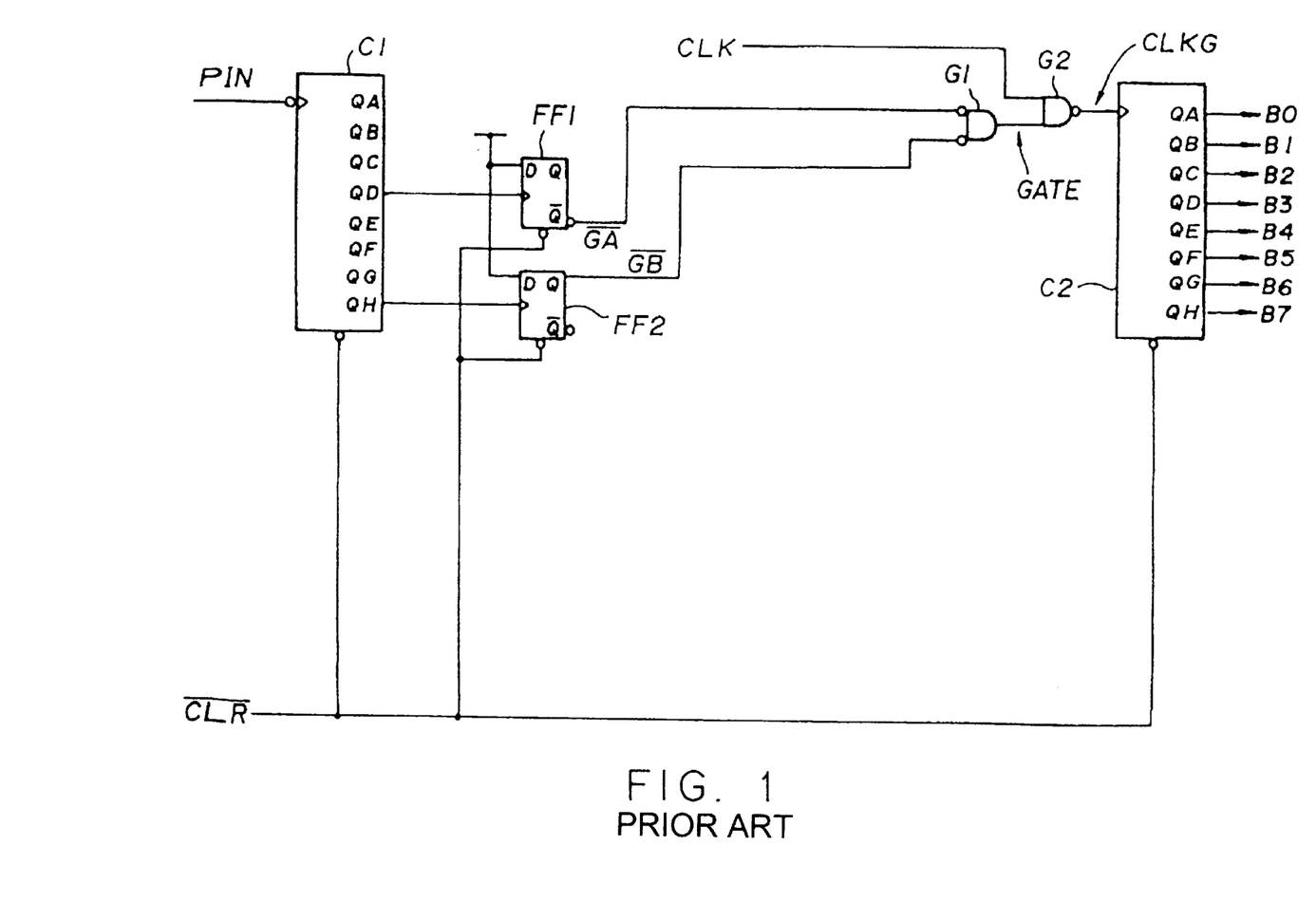
FIG. 1 is a circuit diagram showing a conventional time measurement device.
Figure 2:
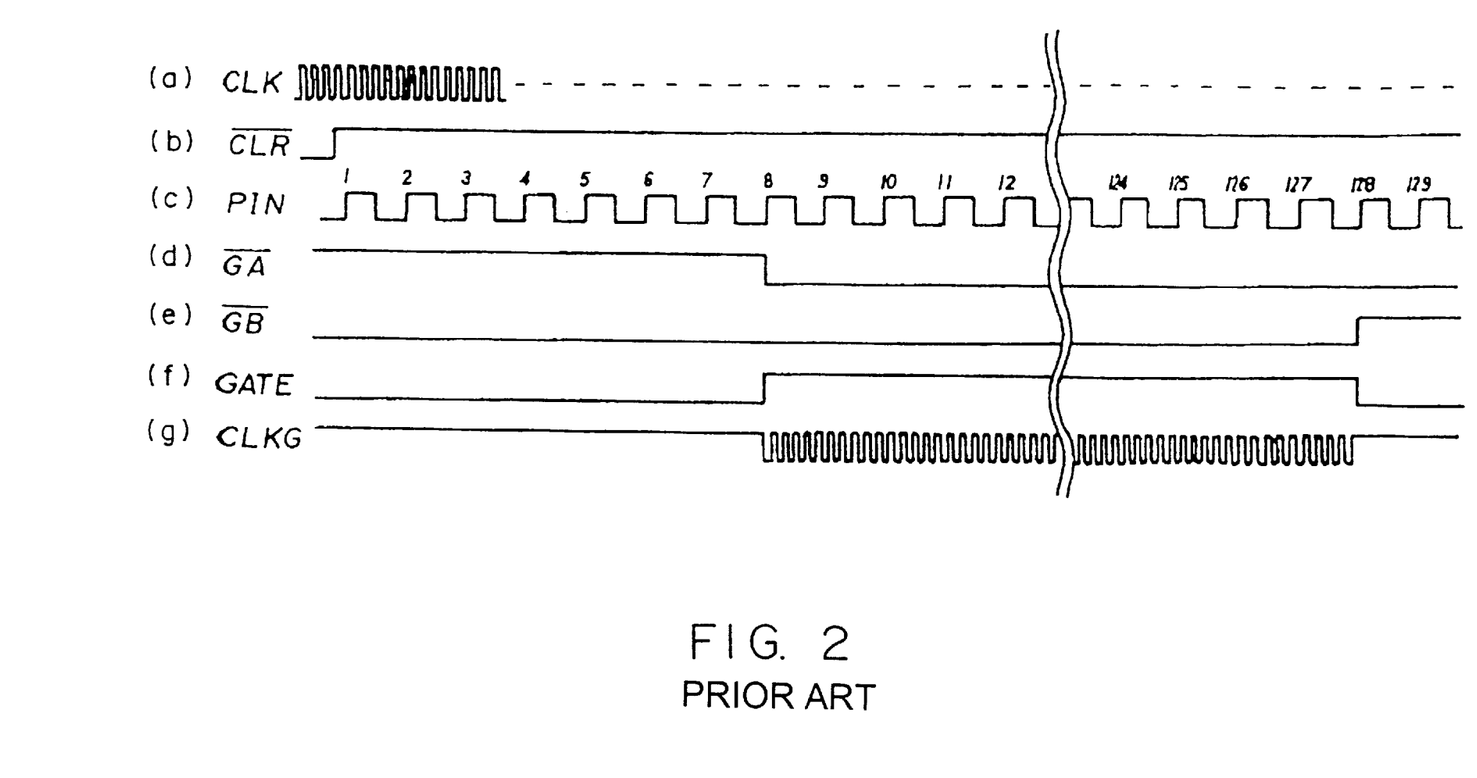
FIG. 2 is a schematic diagram showing the waveforms of signals of the conventional time measurement device.

FIG. 1 shows an example of a conventional time measurement device, while FIG. 2 shows the waveforms of signals propagating from the device.

As shown in FIG. 1, this conventional time measurement device comprises counters C1 and C2, flip-flop circuits FF1 and FF2, and AND gates G1 and G2. CLK, CLR bar, and PIN respectively indicate a reference clock signal, a clear signal and a measurement input pulse.

Referring to FIGS. 1 and 2, the operations performed by this conventional time measurement device are described below.

As shown in (b) in FIG. 2, the clear signal CLR bar (CLR (−): a signal name attached with a bar indicates a signal which is significant at a low level ("L")) is first set to the low level, so that each element is reset. When the measurement input pulse PIN is input to the counter C1, as shown in (c) in FIG. 2, the counter C1 starts counting the pulses of the measurement input pulse PIN.

When the counter C1 counts eight pulses of the measurement input pulse PIN, an output GA bar (GA(−)) of the flip-flop circuit FF1 goes to "L", as shown in (d) in FIG. 2. Since an output GB bar (GB(−)) of the flip-flop circuit FF2 is "L" as shown (e) in FIG. 2 at this time, the AND gate G1 opens and its output signal GATE goes to a high level ("H"), as shown in (f) in FIG. 2. Next, when the counter C1 counts eight bits ($2^7$=128), the GB(−) goes to "H", as shown in (e) in FIG. 2. As a result, the signal GATE goes to "L". While the AND gate G1 is open, that is, while the signal GATE remains "H", the reference clock signal CLK shown in (a) in FIG. 2, passes through the AND gate G2 as a CLKG signal, as shown in (g) in FIG. 2. The counter C2 counts the pulses of the CLKG signal, so that the time value according to the cycle of the measurement input pulse PIN can be obtained.

Figure 3:
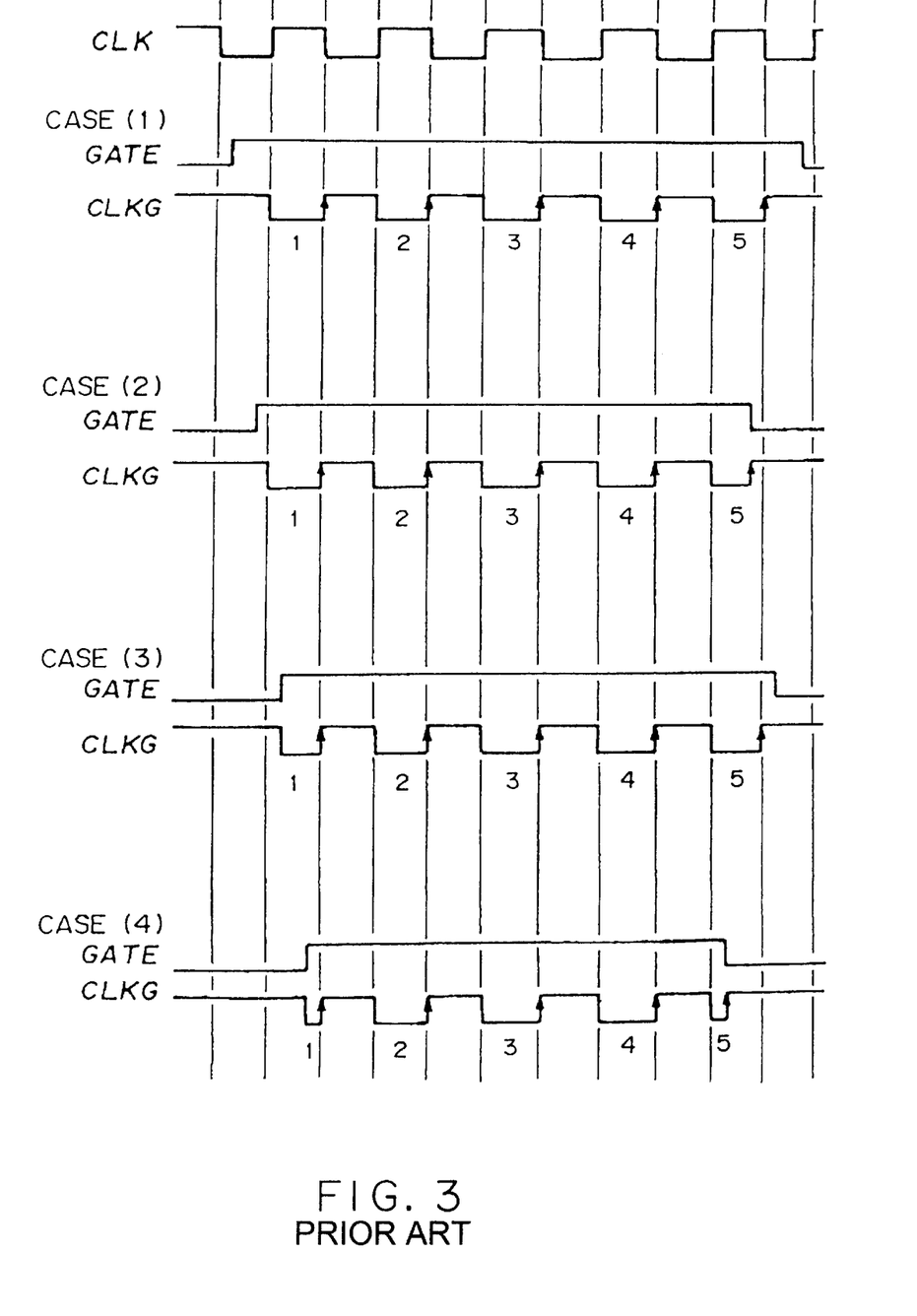
FIG. 3 is a schematic diagram for explaining a problem of time measurement in the conventional time measurement device.

Because the reference clock signal CLK is asynchronous with the rising or falling of the signal GATE (an asynchronous type), the four typical cases shown as the cases (1) through (4) of FIG. 3 may occur.

In these four cases, each of the count values is "5", and the gate width of the signal GATE is a multiple of 4.5 to 5.5 times the width (pulse cycle) of the reference clock signal CLK in case (1), a multiple of 4 to 5 in cases (2) and (3), and a multiple of 3.5 to 4.5 in case (4). That is, the gate width of this signal has a width of (4.5±1)×(pulse cycle of CLK). Since each of the count values does not vary if the gate width of the signal GATE varies in the range of (4.5±1)×(pulse cycle of CLK), an error of ±1 clock pulse occurs in a time measurement result. Consequently, the resolution of measurement deteriorates. Although a method for increasing the speed of the clock signal, or a method for extending the gate time (increasing the number of bits of the counter) may be considered in this case, the former has the problem that the electric current to be consumed becomes higher, while the latter has the problem that the measurement time becomes longer.

Figure 4:
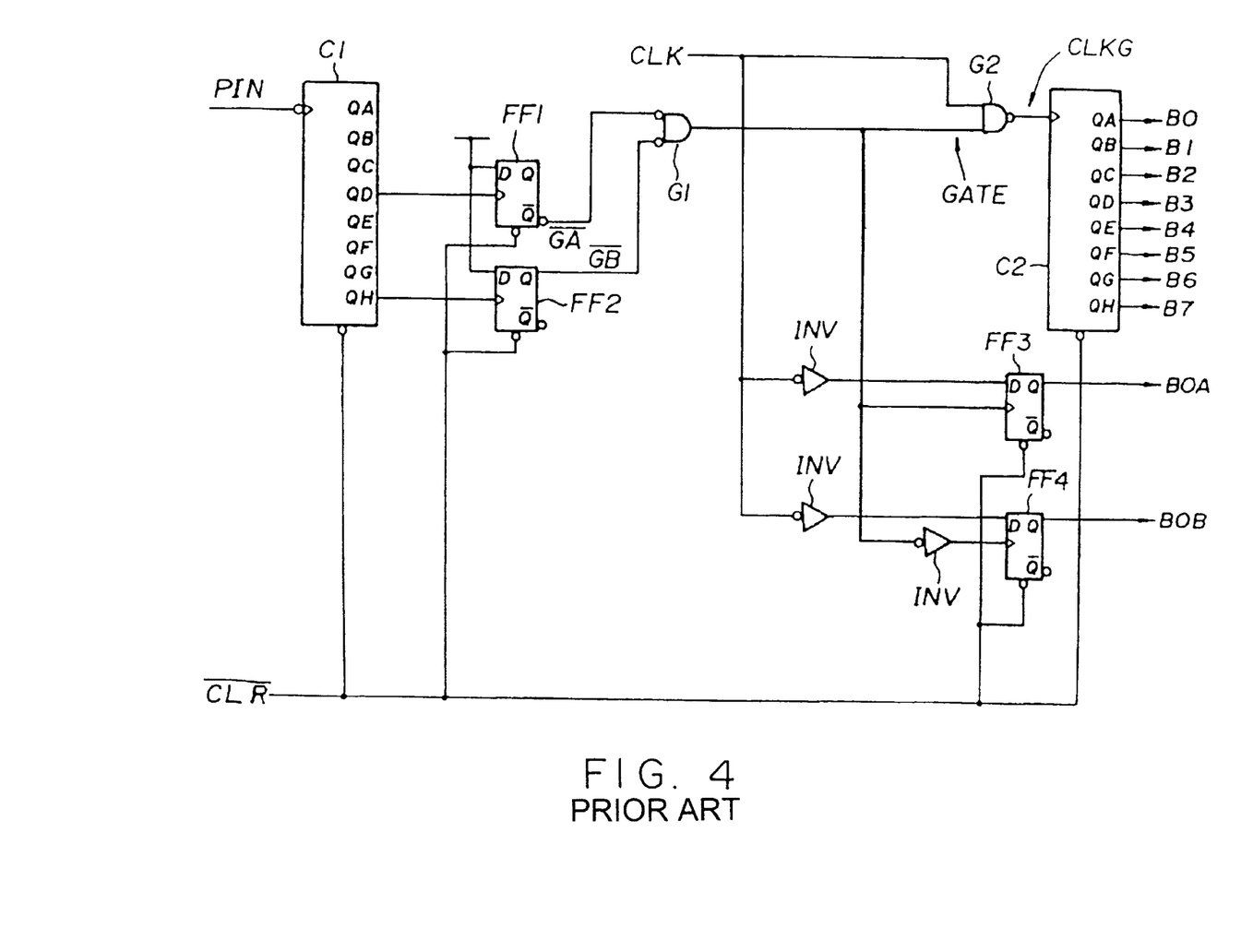
FIG. 4 is a circuit diagram showing one example of a time measurement circuit.

Therefore, the present applicant proposed the time measurement circuit shown in FIG. 4 in the Japanese Laid-Open Patent Publication TOKKAI-HEI 7-72273.

2

As is evident in comparison with the circuit shown in FIG. 1, this time measurement circuit is characterized in that flip-flop circuits FF3 and FF4 are added to the circuit shown in FIG. 1. INV shown in this figure indicates an inverter or inversion circuit. The flip-flop circuit FF3 holds the state of the clock signal CLK when the gate signal GATE rises (L→H), while the flip-flop circuit FF4 holds the state of the clock signal when the gate signal falls (H→L). These states are respectively represented by outputs BOA and BOB.

Provided below is an explanation about the operations performed by the time measurement circuit shown in FIG. 4, by referring to FIGS. 5 through 7.

Figure 5:
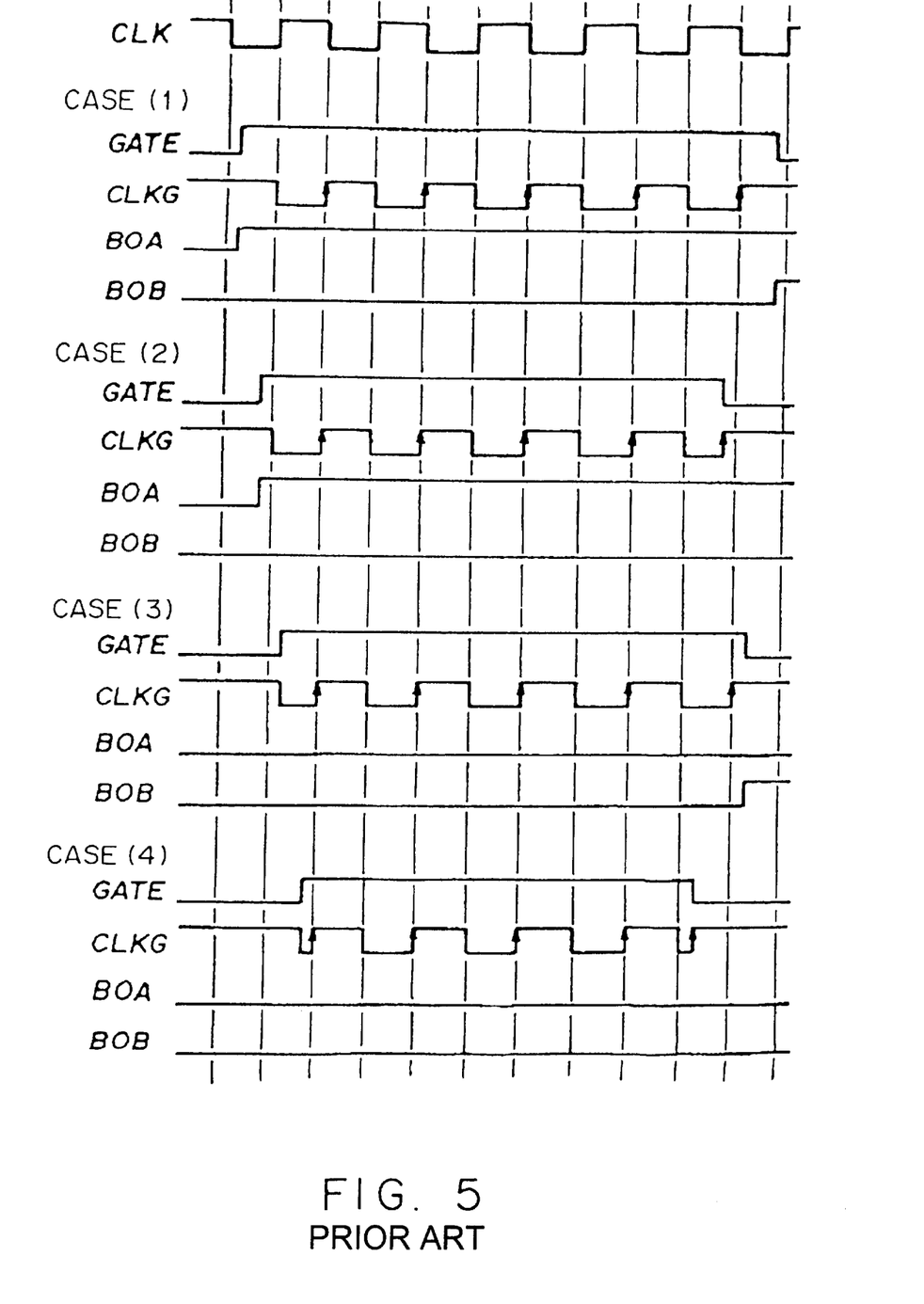
FIG. 5 is a schematic diagram for explaining the operations performed by the time measurement circuit shown in FIG. 4.
Figure 6:
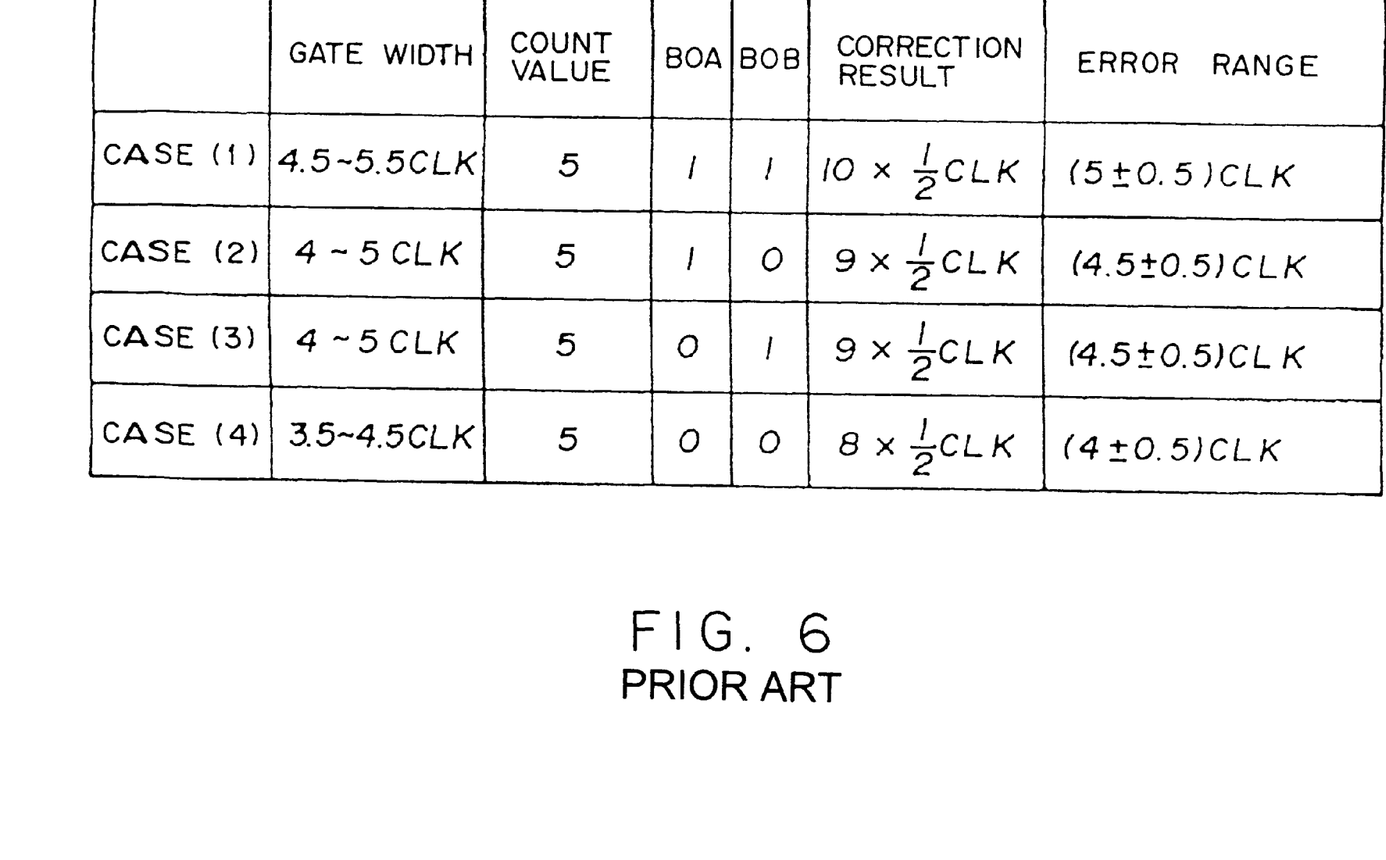
FIG. 6 is a schematic diagram for explaining a count correction made by the time measurement circuit shown in FIG. 4.

FIG. 5 corresponds to FIG. 3, and represents the relationship between each of the CLK, GATE, CLKG signals, and the outputs BOA and BOB of FF3 and FF4.

In this figure, case (1) represents the case where both the outputs BOA and BOB become "1"; case (2) represents the case where BOA and BOB respectively become "1" and "0"; case (3) represents the case where BOA and BOB respectively become "0" and "1"; and case (4) represents the case where both BOA and BOB become "0". This time measurement circuit makes corrections, shown in FIG. 6, depending on the respective cases, so that a measurement error is within a range of ±0.5 clock pulse.

Figure 7:
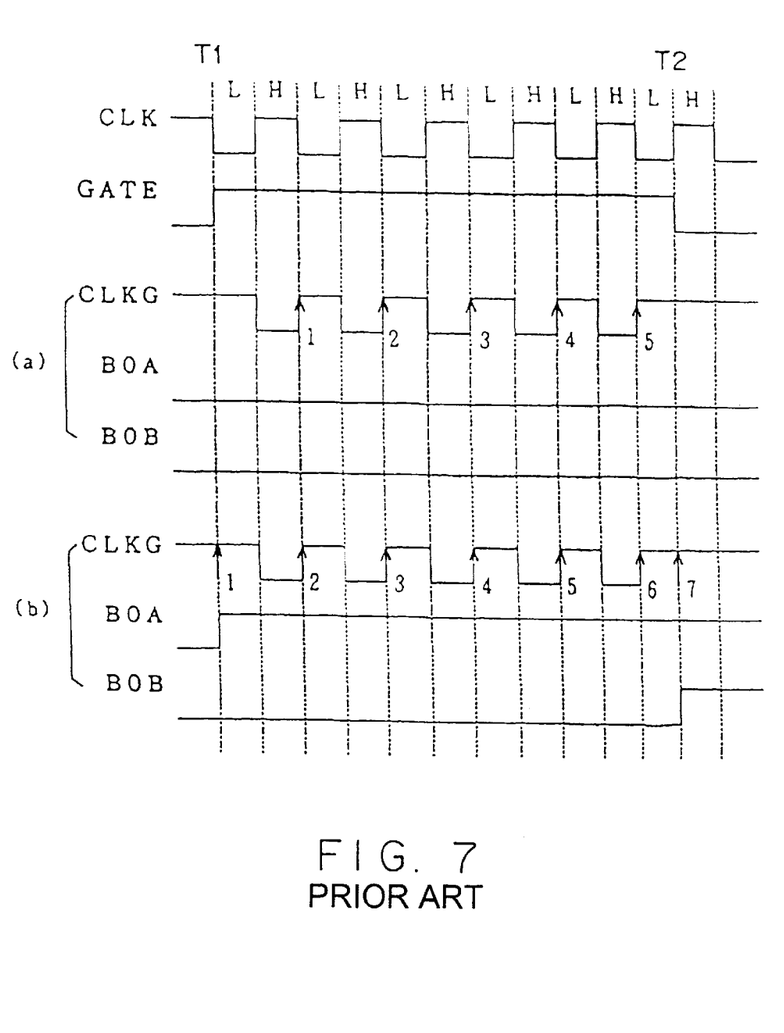
FIG. 7 is a schematic diagram for explaining a problem of time measurement in the time measurement circuit shown in FIG. 4.

With this time measurement circuit, however, the two cases shown in (a) and (b) in FIG. 7 can be considered as the case where the leading (rising) or trailing (falling) edge of the gate signal GATE is almost the same timing as that of the rising or falling edge of the clock signal CLK. The case shown in (a) in FIG. 7 is the case where both the levels of the clock signal CLK at the leading and trailing edges of the gate signal GATE are determined to be "H", although the counter does not perform its count operations at times T1 and T2 (count value=5). In the meantime, the case shown in (b) in FIG. 7 is the case where the levels of the clock signal CLK at the leading and trailing edges of the gate signal are determined to be "L" although the counter performs its count operations at the times T1 and T2 (count value=7). The result of correction at this time will become (5.5±1.5)× CLK, whose error is larger than that in the result (6±1)×CLK in the case where the correction is not made.

SUMMARY OF THE INVENTION

The present invention mainly aims at improving a resolution of a time measurement circuit without increasing either the electric current to be consumed or the measurement time.

The time measurement device according to the present invention is for measuring a time width (duration of a pulse) such as a period or cycle of an input signal, and comprises a first gate for generating a gate signal according to a counted value of input signals; a first holding (latching) unit for holding the gate signal at the time of falling of the clock signal; a second holding unit for holding the gate signal at the time of rising of the clock signal; a second gate for passing the clock signal according to either of the widths of the output signals of the first and second holding circuits; a third holding unit for holding an output state of the second holding unit at the timing of a leading edge of an output of the first holding circuit; a fourth holding unit for holding an output state of the second holding unit at the timing of a trailing edge of an output of the first holding circuit; and a counter for counting the clock signal output from the second gate.

This time measurement device further comprises a correcting device for correcting the count value obtained by the counter based on the outputs of the third and fourth holding units. The correcting device adopts one of multiples of the count value, the count value plus ½, and the count value minus ½ as a measurement result, based on the outputs of the third and fourth holding units.

The time measurement device may further comprise a first clock outputting unit for supplying the clock signal to the first and second holding circuits only at a first time interval in the vicinity of the leading edge of the gate signal; and a second clock outputting unit for supplying the clock signal to the first and second holding circuits only at a second time interval in the vicinity of the trailing edge of the gate signal. In this case, the first and second time intervals are shorter than the interval of the gate signal.

Another time measurement device according to the present invention comprises a first gate for generating a gate signal according to a counted value of input signals; a first clock outputting unit for outputting a clock signal at a first time interval shorter than the interval of the gate signal in the vicinity of the leading edge of the gate signal; a first holding unit for holding the gate signal at the time of falling of the clock signal; a second holding unit for holding the gate signal at the time of rising of the clock signal; a third holding unit for holding the output state of the first holding circuit at the timing of the leading edge of the output of the second holding circuit; a second clock outputting unit for outputting the clock signal at a second time interval shorter than the interval of the gate signal in the vicinity of the trailing edge of the gate signal; a fourth holding unit for holding the gate signal at the time of falling of the clock signal; a fifth holding unit for holding the gate signal at the time of rising of the clock signal; a sixth holding unit for holding the output state of the fourth holding circuit at the timing of the leading edge of the output of the fifth holding circuit; a second gate for passing the clock signal at a time determined by two among the four output signals of the first, second, fourth and fifth holding circuits; and a counter for counting the clock signal output from the second gate. This time measurement device may further comprise a correcting device for correcting the count value obtained by the counter based on the outputs of the third and sixth holding circuits.

A time measurement method according to the present invention is for measuring a time width such as a period or cycle of input signals, and comprises the steps of generating a gate signal according to a counted value of input signals; holding the gate signal from the time of falling of the clock signal, and outputting a first signal; holding the gate signal at the time of rising of the clock signal, and outputting a second signal; holding an output state of the second signal at the timing of a leading edge of the first signal and outputting a third signal; and holding the output state of the second signal at the timing of a trailing edge of the first signal, and outputting a fourth signal; passing the clock signal according to either of the widths of the first and second signals; and counting the passed clock signal.

This time measurement method may further comprise the step of correcting a count value of the clock signal based on the third and fourth signals. With this correction, for example, one of the count value, the count value plus ½, and the count value minus ½ is selected as a measurement result based on the outputs of the third and fourth signals.

The time measurement method may further comprise the steps of supplying the clock signal at the first time interval in the vicinity of the leading edge of the gate signal; and supplying the clock signal at the second time interval in the vicinity of the trailing edge of the gate signal. In this case, the first and second time intervals are shorter than the interval of the gate signal.

Another time measurement device according to the present invention comprises: a first gate for generating a gate signal according to a counted value of input signals; a first holding unit for holding the gate signal at a timing of a first change of the clock signal; a second holding unit for holding the gate signal at a timing of a second change, which is opposite to the first change, of the clock signal; a second gate unit for passing the clock signal according to one of the widths of output signals of the first and second holding unit; a third holding unit for holding an output state of the second holding unit at a timing of a leading edge of an output of the first holding unit; a fourth holding unit for holding an output state of the second holding unit at a timing of a trailing edge of the output of the first holding unit; and a counter for counting a clock signal output from the second gate.

Another time measurement method according to the present invention comprises the steps of: generating a gate signal according to a counted value of input signals; holding the gate signal from a timing of first type of change of the clock signal, and outputting a first signal; holding the gate signal from a timing of second type of change of the clock signal, and outputting a second signal; holding an output state of the second signal at a timing of a leading edge of the first signal, and outputting a third signal; holding an output state of the second signal at a timing of a trailing edge of the first signal, and outputting a fourth signal; passing the clock signal according to one of the widths of the first signal and the second signal; and counting the passed clock signal.

DESCRIPTION OF THE PREFERRED EMBODIMENT

Figure 8:
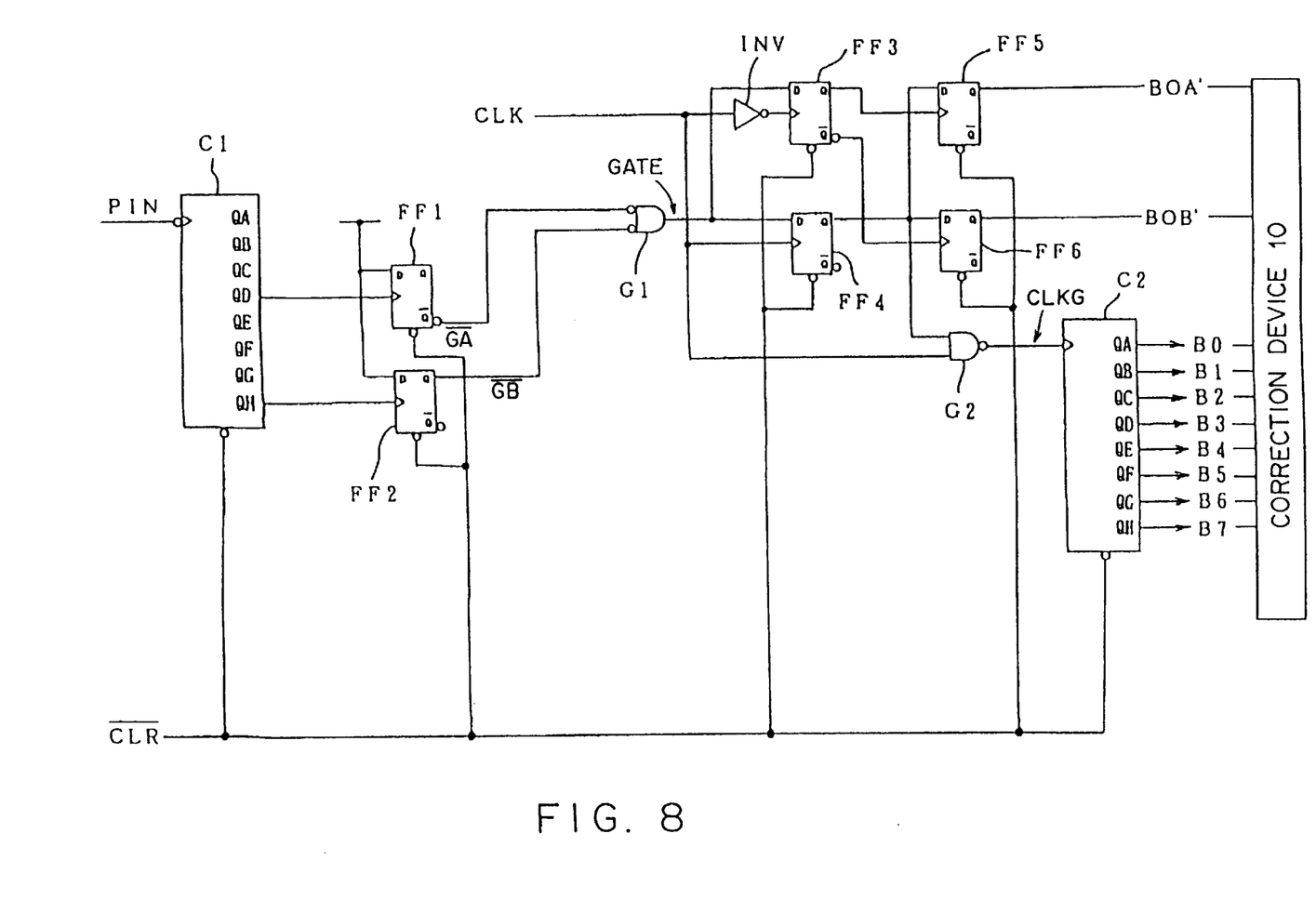
FIG. 8 is a schematic diagram showing the configuration of a time measurement device according to the first embodiment of the present invention.

FIG. 8 is a schematic diagram showing the configuration of a time measurement device according to the first embodiment of the present invention. In this figure, the same constituent elements as those shown in FIGS. 1 and 4 are denoted by the same reference numerals, and their detailed explanations are omitted here.

As shown in FIG. 8, the time measurement device according to the first embodiment comprises counters C1 and C2, flip-flop circuits FF1 through FF6, AND gates G1 and G2, and an inverter (inversion circuit) INV. CLK, CLR bar, and PIN respectively indicate a reference clock signal, a clear signal, and a measurement input pulse. BOA' and BOB' respectively indicate output signals of the flip-flop circuits FF5 and FF6. This time measurement device also includes a correcting device 10 for correcting a count result.

The flip-flop circuit FF3 holds a gate signal from the AND gate G1 at the time of falling of the clock signal CLK, while the flip-flop circuit FF4 holds the gate signal GATE at the time of rising of the clock signal CLK. The flip-flop circuit FF5 holds the output level of the flip-flop circuit FF4 at the time of rising of an output of the flip-flop circuit FF3, while the flip-flop circuit FF6 holds the output level of the flip-flop circuit FF4 at the time of falling of an output of the flip-flop circuit FF3. Since there is a difference of ½ clock pulse between the time of rising and the time of falling of the output of the flip-flop circuit FF3 and the output of the flip-flop circuit FF4, the problem of a measurement error increasing due to an unsuitable correction made at a certain timing, which occurs in the time measurement circuit shown in FIG. 4 (refer to FIGS. 5 through 7), can be prevented by making a suitable correction. Furthermore, a significant error, such as an error occurring in the circuit of FIG. 1, can be prevented.

Figure 9:
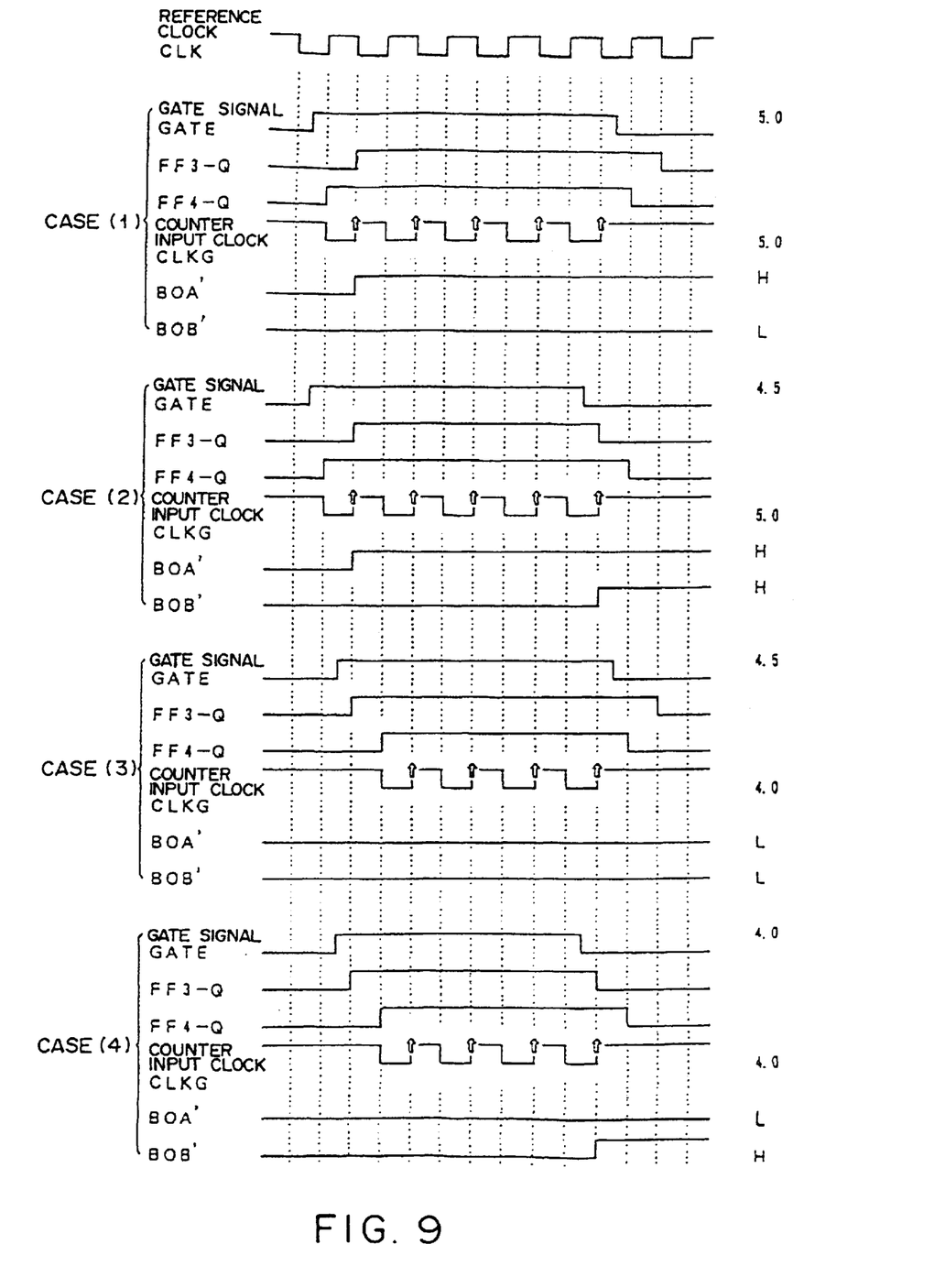
FIG. 9 is a schematic diagram for explaining the operations performed by the time measurement device according to the first embodiment.
Figure 10:
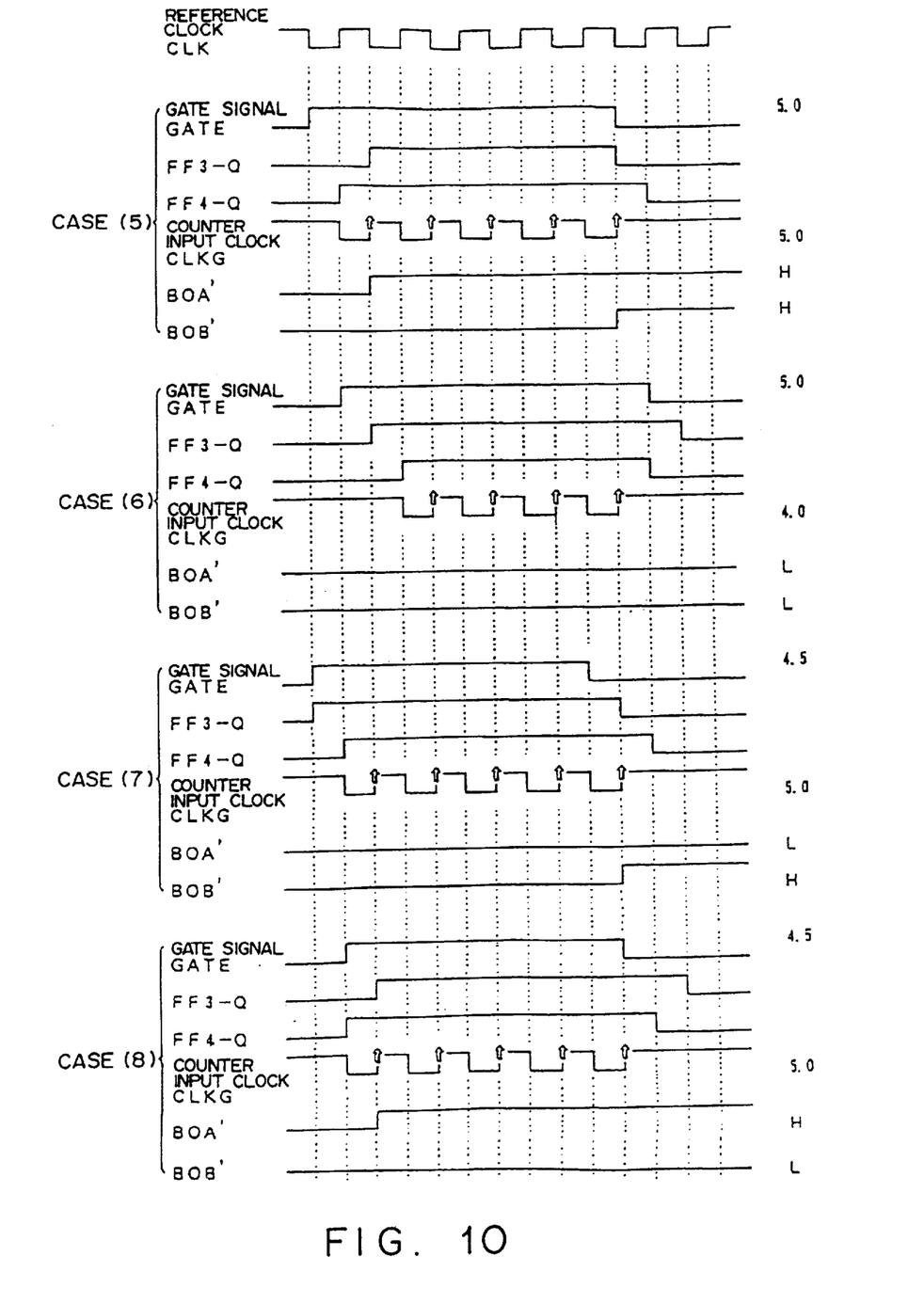
FIG. 10 is a schematic diagram for explaining the operations performed by the time measurement device according to the first embodiment.

FIGS. 9 and 10 are schematic diagrams for explaining the operations performed by the circuit shown in FIG. 8, and FIG. 9 corresponds to FIG. 5. These figures represent the relationship between each of the outputs (FF3-Q and FF4-Q) of the flip-flop circuits FF3 and FF4, and each of the outputs (BOA' and BOB') of the flip-flop circuits FF5 and FF6 as the eight cases (CASES (1) through (8)). According to the present invention, the value counted by the counter C2 is corrected by the correcting device 10 according to the outputs BOA' and BOB'.

Figure 11:
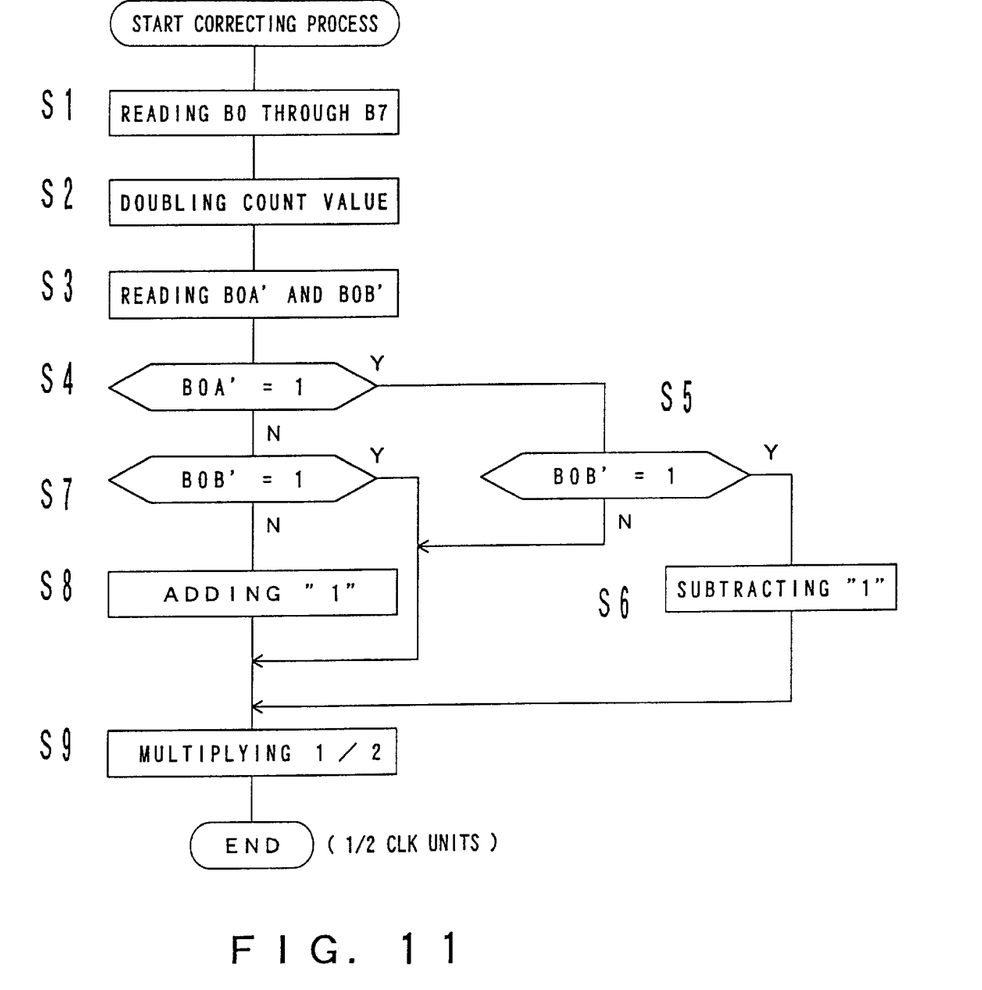
FIG. 11 is a schematic diagram showing a method for correcting a count value according to the first embodiment.

FIG. 11 is a schematic diagram showing the method for correcting the count value, which is performed by the correcting device 10.

The correcting device 10 reads values B0 through B7 of the counter C2 in step S1, and doubles the values in step S2, as shown in FIG. 11. The correcting device then reads the output signals BOA' and BOB' in step S3. In step S4, the correcting device 10 determines the value of the output signal BOA'. If the value is "1" ("Y" in step S4), the process goes to step S5 where the value of the output signal BOB' is determined. If the value of BOB' is "1" ("Y" in step S5), the process goes to step S6 where "1" is subtracted from the result obtained in step S2. Then, the process goes to step S9. If the value of BOB' is not "1" ("N" in step S5), the process goes to step S9. If the value of BOA' is not determined to be "1" ("N" in step S4), the process goes to step S7 where it is determined whether or not the value of BOB' is "1". If it is "1" ("Y" in step S7), the process goes to step S9. If it is not "1" ("N" in step S7), the process goes to step S8 where "1" is added to the result obtained in step S2. Then, the process goes to step S9. In this step, the result obtained in step S2, S6 or S8 is multiplied by ½.

Figure 12:
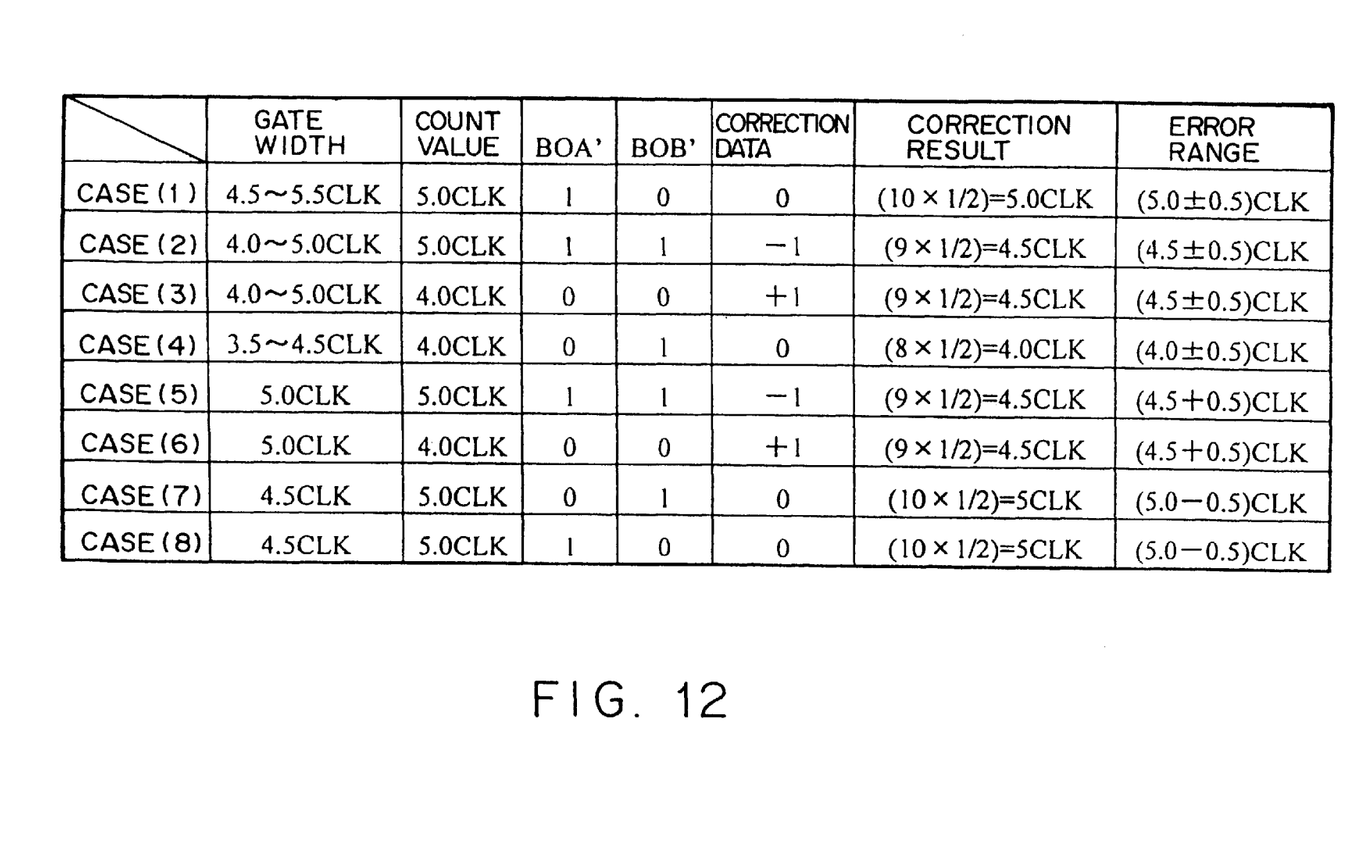
FIG. 12 is a schematic diagram showing the result of a correction of the count value according to the first embodiment.

FIG. 12 shows the result of a correction made by the above described correction process.

The cases (1) through (4) shown in FIG. 12 respectively correspond to the cases (1) through (4) shown in FIG. 9, while the cases (5) through (8) respectively correspond to the cases (5) trough (8) shown in FIG. 10. A gate width column shown in FIG. 12 indicates the width of the gate signal GATE in clock units in the respective cases, while a count value column indicates the result of the count operation performed by the counter C2. BOA' and BOB' columns indicate the values of the outputs BOA' and BOB'. A correction result column indicates a count value after the above described correction process is performed. The difference between the correction result and the gate width appears in an error range column. A correction data column indicates values which are added to or subtracted from the doubled count value in the correction. After the addition or subtraction, the resultant is multiplied by ½, as shown in the correction result column.

The value (the result obtained in step S2, S6 or S8) to be input to step S9 in the above described correction process appears as the first member of each correction result. The value is "10" in cases (1), (7) and (8); "9" in cases (2), (3), (5) and (6); and "8" in case (4). The error range between the correction result and an actual width of the gate signal is (5.0±0.5)×CLK in case (1); (4.5±0.5)×CLK in cases (2) and (3); (4.0±0.5)×CLK in case (4); (4.5+0.5)×CLK in case (5); (4.5+0.5)×CLK in case (6); and (5.0−0.5)×CLK in cases (7) and (8). Therefore, the resolution of ½ CLK (an error of ±0.5 CLK) can always be implemented with the time measurement device according to this embodiment.

Cases (5) through (8) shown in FIG. 12 represent the cases in which the clock signal CLK rises or falls at almost the same timing as that of the leading edge (rising edge) or the trailing edge (falling edge) of the gate signal GATE. In such cases, an error increases up to ±1.5 CLK in the device shown in FIG. 4. However, according to this embodiment, the error is also within ±0.5 CLK with the above described correction process in such cases. Therefore, the resolution of the device can be defined as ½ CLK.

Figure 13:
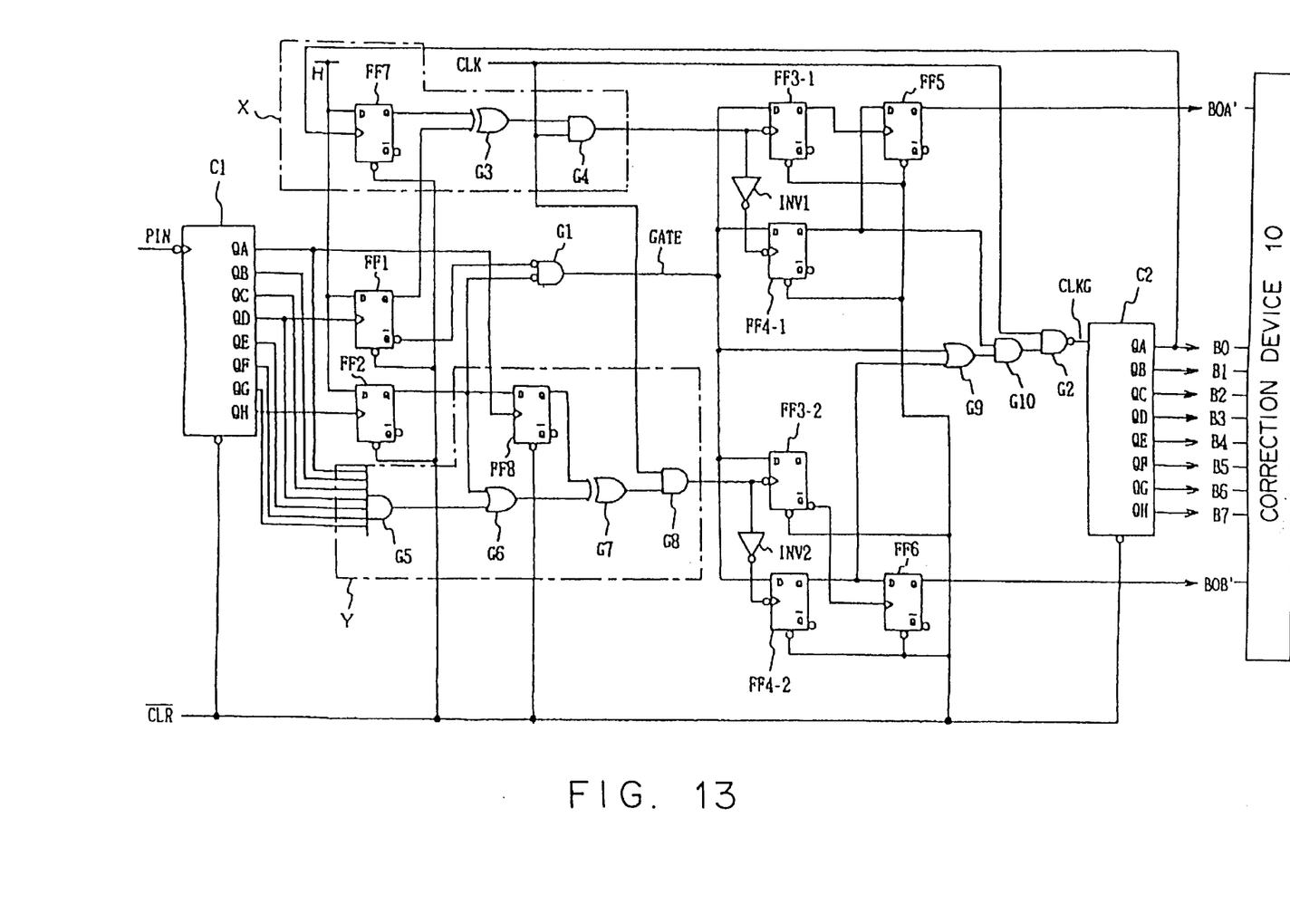
FIG. 13 is a schematic diagram showing the configuration of a time measurement device according to a second embodiment of the present invention.

FIG. 13 is a circuit diagram showing the configuration of the time measurement device according to the second embodiment of the present invention. In this figure, the same constituent elements as those shown in FIGS. 1, 4 and 8 are denoted by the same reference numerals, and their detailed explanations are omitted here.

As shown in FIG. 13, the time measurement device according to the second embodiment comprises counters C1 and C2, flip-flop circuits FF1, FF2, FF3-1, FF3-2, FF4-1, FF4-2 and FF 5 through FF8, gates G1 through G10, inverters (inversion circuits) INV1 and INV2, and a correcting device 10.

This device is basically configured by adding the parts "X" and "Y" enclosed by dashed lines to the device according to the first embodiment, which is shown in FIG. 8. As a result, the time in which the clock signal CLK flows through the flip-flop circuits is decreased, and the resolution of the device can be improved while suppressing consumed electric power to a minimum.

The part "X" shown in FIG. 13 includes the flip-flop circuit FF7 and the gates G3 and G4. This part enables transmission of a clock signal to the flip-flop circuits FF3-1 and FF4-1, which are gate signal holding circuits, only in the vicinity of the rising (leading) edge of the gate signal. The flip-flop circuit FF5 holds the state of the flip-flop circuit FF3-1 at the leading edge of an output of the FF4-1. The part "Y" includes the flip-flop circuit FF8 and the gates G5 through G8. This part enables to transmission of the clock signal to the flip-flop circuits FF3-2 and FF4-2, which are gate signal holding circuits, only in the vicinity of the falling (trailing) edge of the gate signal. FF6 holds the state of FF3-2 at the leading edge of an output of FF4-2.

Figure 14:
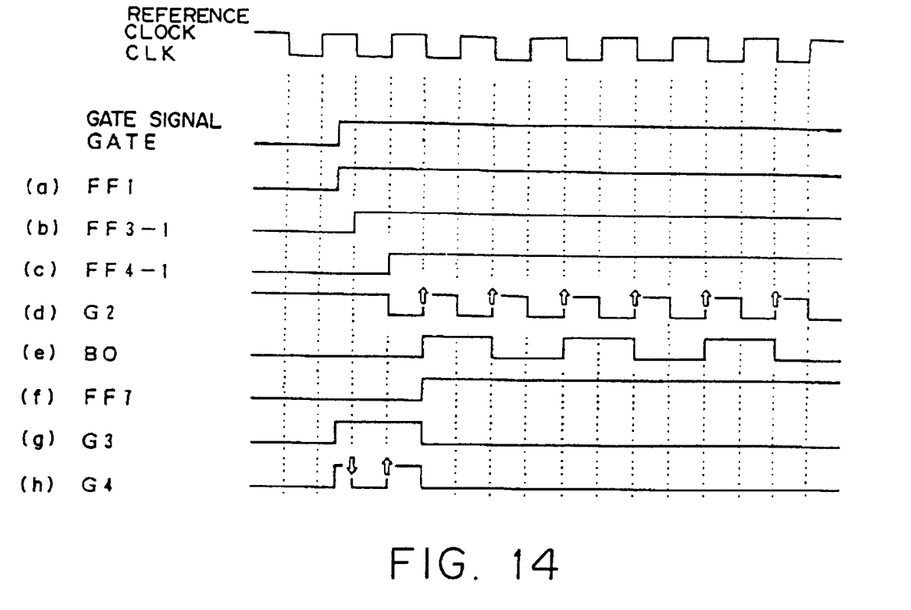
FIG. 14 is a schematic diagram for explaining the operations performed by the time measurement device according to the second embodiment.

FIG. 14 shows the operations associated with the part "X" of FIG. 13.

As shown in (a) in FIG. 14, when an output FF1-Q of the flip-flop circuit FF1 makes a low-to-high ("L"-to-"H") transition after the counter C1 counts 8 pulses of the input signal PIN, the flip-flop circuit FF3-1 holds the gate signal GATE at the falling edge of the clock signal as shown in (b) in FIG. 14, while the flip-flop circuit FF4-1 holds the gate signal GATE at the rising edge of the clock signal CLK, as shown in (c) in FIG. 14. Since G9 is an OR gate, an output of the AND gate G1 is output unchanged at the rising edge of the gate signal GATE. As a result, an output of the AND gate G2 will become as shown in (d) in FIG. 14 because AND gate G10 receives an "H" signal from the flip-flop circuit FF4-1. The counter C2 starts its count operation according to the output CLKG of the AND gate G2 CLKG. When the output C2-BO, which is an output of QA of the counter C2, rises as shown in (e) in FIG. 14, the flip-flop circuit FF7 is set as shown in (f) in FIG. 14. Consequently, the clock signal CLK is transmitted to the flip-flop circuits FF3-1 and FF4-1 as shown in (h) in FIG. 14 only while the output of the gate G3 remains "H" as shown in (g) in FIG. 14. This time period is from the start of the "H" output of the flip-flop circuit FF1 to the start of "H" output of the flip-flop circuit FF7, that is the period in which the gate G4 receives "H" outputs from the gate G3.

Figure 15:
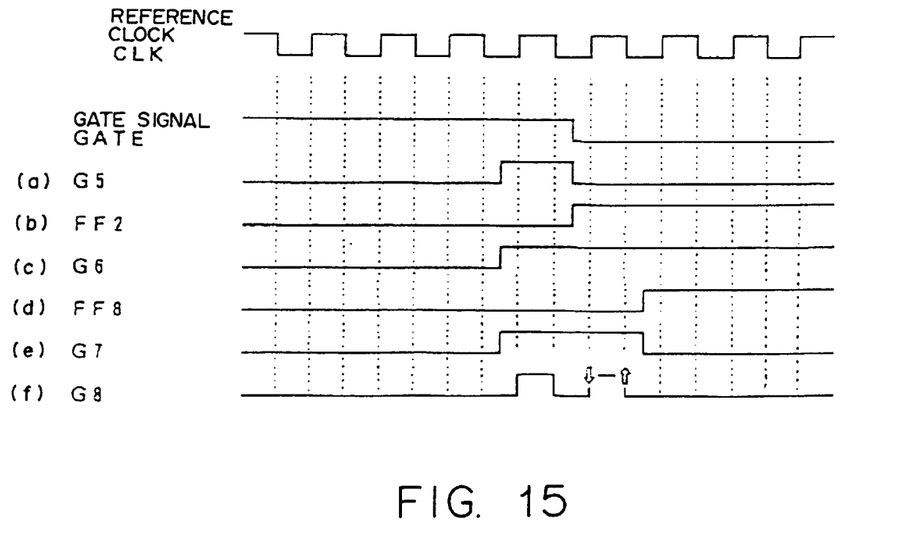
FIG. 15 is a schematic diagram for explaining the operations performed by the time measurement device according to the second embodiment.

FIG. 15 shows the operations associated with the part "Y" of FIG. 13.

When a measurement input pulse PIN is input to the counter C1, the counter C1 starts counting the pulse PIN. The output of the gate G5 which performs an AND operation for the outputs QA through QG will become as shown in (a) in FIG. 15. As shown in this figure, the gate G5 outputs an "H" signal only for the input signal PIN just before the last count signal GH is output from the counter C1. Additionally, the output of the gate G6 will become as shown in (c) in FIG. 15 according to a Q output of the flip-flop circuit FF2 shown in (b) in FIG. 15. At the time, the output of the gate G6 becomes "H", and the flip-flop circuit FF8 holds the Q output of the flip-flop circuit FF2 at the rising edge of the output QA of the counter C1, as shown in (d) in FIG. 15. As a result, the output of the gate G7 will become as shown in (e) in FIG. 15, and the clock signal CLK is transmitted to the flip-flop circuits FF3-2 and FF4-2 only while the output of the gate G7 remains "H", as shown in (f) in FIG. 15.

In general, the power consumption of the device becomes high while the clock signal CLK flows through the flip-flop circuits. However, as this period is shortened according to this embodiment, the resolution of the time measuring device can be improved without increasing the power consumption and raising the frequency of the clock signal. Although a plurality of elements are added in this embodiment as compared with the first embodiment, digital elements, which are less expensive than analog elements, can be used for the elements to be added. Therefore, the power consumption of the time measuring device can be lowered without increasing the cost of the device.

What is claimed is:

1. A time measurement device for measuring a time width of a pulsed input signal based on a clock signal which successively rises and falls, comprising:

first gate means for generating a gate signal having a width according to a counted value of pulses of the input signal;

first holding means for holding the gate signal at a time of falling of the clock signal, the first holding means producing a first output which has a leading edge and a second output which has a trailing edge, the outputs having a width;

second holding means for holding and outputting the gate signal at a time of rising of the clock signal, the second holding means output having a width;

second gate means for passing the clock signal according to one of the widths of the output signals of said first and second holding means;

third holding means for holding an output state of said second holding means at a timing of the leading edge of the first output of said first holding means;

fourth holding means for holding an output state of said second holding means at a timing of the trailing edge of the second output of said first holding means; and counter means for counting a clock signal output from said second gate means.

2. The time measurement device according to claim 1, further comprising a correcting means for correcting a count value obtained by said counter means, based on outputs of said third and fourth holding means.

3. The time measurement device according to claim 2, wherein said correcting means adopts one of the count value, the count value plus ½, and the count value minus ½, based on the outputs of the third and fourth holding means.

4. The time measurement device according to claim 1 wherein the gate signal has a leading edge and a trailing edge, further comprising:

first clock outputting means for supplying the clock signal to said first and second holding means only at a first time interval in a vicinity of the leading edge of the gate signal; and second clock outputting means for supplying the clock signal to said first and second holding means only at a second time interval in a vicinity of the trailing edge of the gate signal.

5. The time measurement device according to claim 4, wherein the first and second time intervals are shorter than an interval of the gate signal.

6. A time measurement device for measuring a time width of a pulsed input signal based on a clock signal which successively rises and falls, comprising:

first gate means for generating a gate signal having a leading edge and a trailing edge, and an interval according to a counted value of pulses of said input signal;

first clock outputting means for outputting the clock signal at a first time interval shorter than the interval of the gate signal in a vicinity of the leading edge of the gate signal;

first holding means for holding and outputting the gate signal at a time of falling of the clock signal;

second holding means for holding and outputting the gate signal at a time of rising of the clock signal;

third holding means for holding and outputting an output state of said first holding means at a timing of a leading edge of the output of said second holding means;

second clock outputting means for outputting the clock signal at a second time interval shorter than the interval of the gate signal in a vicinity of the trailing edge of the gate signal;

fourth holding means for holding and outputting the gate signal at a time of falling of the clock signal;

fifth holding means for holding and outputting the gate signal at a time of rising of the clock signal;

sixth holding means for holding and outputting an output state of said fourth holding means at a timing of a leading edge of the output of said fifth holding means;

second gate means for passing the clock signal in a time determined by two output signals of said first, second, fourth and fifth holding means; and counter means for counting the clock signal output from said second gate means.

7. The time measurement device according to claim 6, further comprising a correcting means for correcting a count value obtained by said counter means, based on the outputs of said third and sixth holding means.

8. A time measurement method for measuring a time width of a pulsed input signal based on a clock signal which successively rises and falls, comprising the steps of:

generating a gate signal according to a counted value of pulses of the input signal;

holding the gate signal from a time of falling of the clock signal, and outputting at least one first signal, the first signal having a leading edge and a trailing edge, and a width;

holding the gate signal from a time of rising of the clock signal, and outputting a second signal, the second signal having a width;

holding an output state of the second signal at a timing of the leading edge of the first signal, and outputting a third signal;

holding an output state of the second signal at a timing of the trailing edge of the first signal, and outputting a fourth signal;

passing the clock signal according to one of the widths of the first and second signals; and counting the passed clock signal.

9. The time measurement method according to claim 8, further comprising the step of correcting a count value of the clock signal based on the third and fourth signals.

10. The time measurement method according to claim 9, wherein one of the count value, the count value plus ½, and the count value minus ½ is selected as a measurement result based on the third and fourth signals in the correcting step.

11. The time measurement method according to claim 8 wherein the gate signal has a leading edge and a trailing edge, further comprising the steps of:

supplying the clock signal at a first time interval in a vicinity of the leading edge of the gate signal; and supplying a clock signal at a second time interval in a vicinity of the trailing edge of the gate signal.

12. The time measurement method according to claim 11, wherein the first and second time intervals are shorter than the interval of the gate signal.

13. A time measurement device for measuring a time width of a pulsed input signal based on a clock signal, comprising:

first gate means for generating a gate signal having a width according to a counted value of pulses of the input signal;

first holding means for holding the gate signal at a timing of a first type of change of the clock signal, the first holding means producing at least one output which has a leading edge, a trailing edge and a width;

second holding means for holding and outputting the gate signal at a timing of a second type of change of the clock signal, the second holding means output having a width;

second gate means for passing the clock signal according to one of the widths of the output signals of said first and second holding means;

third holding means for holding and outputting an output state of said second holding means at a timing of the leading edge of the output of said first holding means;

fourth holding means for holding and outputting an output state of said second holding means at a timing of the trailing edge of the output of said first holding means; and counter means for counting a clock signal output from said second gate means.

14. A time measurement method for measuring a time width of a pulsed input signal based on a clock signal, comprising the steps of:

generating a gate signal according to a counted value of pulses of the input signal;

holding the gate signal from a timing of a first type of change of the clock signal, and outputting a first signal having a leading edge, a trailing edge and a width;

holding the gate signal from a timing of a second type of change of the clock signal, and outputting a second signal having a width;

holding an output state of the second signal at a timing of the leading edge of the first signal, and outputting a third signal;

holding an output state of the second signal at a timing of the trailing edge of the first signal, and outputting a fourth signal;

passing the clock signal according to one of the widths of the first signal and the second signal; and counting the passed clock signal.

* * * * *